United States Patent
Kang et al.

(10) Patent No.: US 12,051,456 B2
(45) Date of Patent: Jul. 30, 2024

(54) MEMORY DEVICES AND OPERATION METHODS THEREOF INCLUDING A WRITE VOLTAGE SELECTIVELY APPLIED TO A WELL OF A COLUMN MULTIPLEXER CIRCUIT

(71) Applicant: Samsung Electronics Co., Ltd., Suwon-si (KR)

(72) Inventors: Gyuseong Kang, Goyang-si (KR); Suk-Soo Pyo, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 192 days.

(21) Appl. No.: 17/695,941

(22) Filed: Mar. 16, 2022

(65) Prior Publication Data
US 2022/0343961 A1  Oct. 27, 2022

(30) Foreign Application Priority Data
Apr. 21, 2021  (KR) .................. 10-2021-0051994

(51) Int. Cl.
*G11C 11/16*  (2006.01)

(52) U.S. Cl.
CPC ...... *G11C 11/1675* (2013.01); *G11C 11/1655* (2013.01); *G11C 11/1657* (2013.01); *G11C 11/1697* (2013.01); *G11C 11/161* (2013.01)

(58) Field of Classification Search
None
See application file for complete search history.

(56) References Cited

U.S. PATENT DOCUMENTS

| | | | |
|---|---|---|---|
| 5,336,952 A * | 8/1994 | Iwahashi | G11C 16/12 365/185.23 |
| 5,708,599 A * | 1/1998 | Sato | G11C 11/418 365/189.09 |
| 6,549,465 B2 | 4/2003 | Hirano et al. | |
| 7,548,484 B2 | 6/2009 | Lee | |
| 7,710,191 B2 | 5/2010 | Inada et al. | |
| 8,125,817 B2 | 2/2012 | Takagi et al. | |
| 9,312,000 B1 | 4/2016 | Song | |
| 9,324,406 B2 | 4/2016 | Shuto et al. | |
| 9,959,919 B2 | 5/2018 | Saida et al. | |
| 2008/0266983 A1 | 10/2008 | Kim et al. | |

(Continued)

FOREIGN PATENT DOCUMENTS

| JP | 5108672 B2 | 10/2012 |
|---|---|---|
| KR | 20120086955 A | 8/2012 |

*Primary Examiner* — J. H. Hur
(74) *Attorney, Agent, or Firm* — Myers Bigel, P.A.

(57) ABSTRACT

A memory device which includes a control logic circuit that generates a write enable signal based on a write command, a first memory cell connected with a first word line and a first column line, a first write circuit that receives first write data to be stored in the first memory cell through a first write input/output line and applies a write voltage to a first data line based on the first write data in response to the write enable signal, and a first column multiplexer circuit that selects the first column line and connects the first column line with the first data line in response to a first column select signal, such that the write voltage is applied to the first memory cell. The first write circuit applies the write voltage to a bulk port of the first column multiplexer circuit in response to the write enable signal.

19 Claims, 12 Drawing Sheets

(56) References Cited

U.S. PATENT DOCUMENTS

| | | | |
|---|---|---|---|
| 2012/0155168 A1* | 6/2012 | Kim | G11C 5/14 |
| | | | 365/185.23 |
| 2014/0050020 A1* | 2/2014 | Lee | G11C 7/1081 |
| | | | 365/158 |
| 2014/0293684 A1* | 10/2014 | Yi | G11C 11/1653 |
| | | | 365/158 |

* cited by examiner

MEMORY DEVICES AND OPERATION METHODS THEREOF INCLUDING A WRITE VOLTAGE SELECTIVELY APPLIED TO A WELL OF A COLUMN MULTIPLEXER CIRCUIT

CROSS-REFERENCE TO RELATED APPLICATION

This application claims priority under 35 U.S.C. § 119 to Korean Patent Application No. 10-2021-0051994, filed on Apr. 21, 2021, in the Korean Intellectual Property Office, and the entire contents of the above identified application are incorporated by reference herein.

TECHNICAL FIELD

Aspects of the present disclosure described herein relate to semiconductor memories, and more particularly, relate to memory devices including write drivers and column multiplexer circuits and to operation methods thereof.

BACKGROUND

A semiconductor memory device may be classified as a volatile memory device or as a nonvolatile memory device. In a volatile memory device, such as a static random access memory (SRAM) or a dynamic random access memory (DRAM), stored data may disappear when a power supply is turned off In a nonvolatile memory device, stored data may be retained even when a power supply is turned off or disconnected. Examples of nonvolatile memory devices include a flash memory device, a phase-change RAM (PRAM), a magnetic RAM (MRAM), a resistive RAM (RRAM), or a ferroelectric RAM (FRAM).

A MRAM may include a variable resistance element (or a magnetic tunnel junction (MTJ)). A magnetization direction of the MTJ may be changed according to a direction of a current applied to the MTJ, and a resistance value of the MTJ may vary with the magnetization of the MTJ. The MRAM may store or read data by using the above characteristic of the MTJ.

SUMMARY

Some embodiments of the present disclosure provide memory device in which occurrences of a latch-up phenomena during a write operation may be reduced or prevented. The memory device may also have a reduced area.

According to some embodiments, a memory device may include a control logic circuit configured to generate a write enable signal based on a write command, a first memory cell that is connected with a first word line and a first column line, a first write circuit configured to receive first write data to be stored in the first memory cell through a first write input/output line and configured to apply a write voltage to a first data line based on the first write data in response to the write enable signal, and a first column multiplexer circuit that is configured to select the first column line and connect the first column line with the first data line in response to a first column select signal, such that the write voltage is applied to the first memory cell. The first write circuit is configured to apply the write voltage to a bulk port of the first column multiplexer circuit in response to the write enable signal.

According to some embodiments, a memory device includes a control logic circuit configured to generate a write enable signal based on a write command, a first memory cell that is connected with a first word line, a first source line, and a first bit line, a first write circuit that includes a first switch configured to apply an anti-parallel reference voltage to a peripheral circuit source line based on first write data to be stored in the first memory cell, a second switch configured to apply a parallel reference voltage to a peripheral circuit bit line based on the first write data, and a third switch configured to apply a high voltage signal from among the anti-parallel reference voltage and the parallel reference voltage to a bulk port based on the write enable signal, and a first column multiplexer circuit that includes a source line selecting switch configured to connect the peripheral circuit source line and the first source line based on a first column select signal, a bit line selecting switch configured to connect the peripheral circuit bit line and the first bit line based on the first column select signal, and the bulk port. The bulk port is electrically connected with a single n-well shared by at least two PMOS transistors included in the source line selecting switch and the bit line selecting switch.

According to some embodiments, an operation method of a memory device which is configured to perform a write operation based on a write command received from an external device includes generating a write enable signal based on the write command, controlling a word line, a source line, and a bit line to select a memory cell, in which write data are to be written, in response to the write enable signal, generating a write voltage in response to the write enable signal, applying the write voltage to the source line or the bit line connected with the memory cell, applying the write voltage to a bulk port of a column multiplexer circuit configured to select the source line and the bit line, and applying a power supply voltage to the bulk port when the write operation is completed. The memory cell includes a magnetic random access memory (MRAM) cell.

BRIEF DESCRIPTION OF THE FIGURES

The above and other objects and features of the present disclosure will become apparent by describing in detail some example embodiments thereof with reference to the accompanying drawings.

DETAILED DESCRIPTION

Below, some example embodiments of the present disclosure will be described in clear and sufficient detail such that one skilled in the art may carry out the present disclosure.

Figure 1:
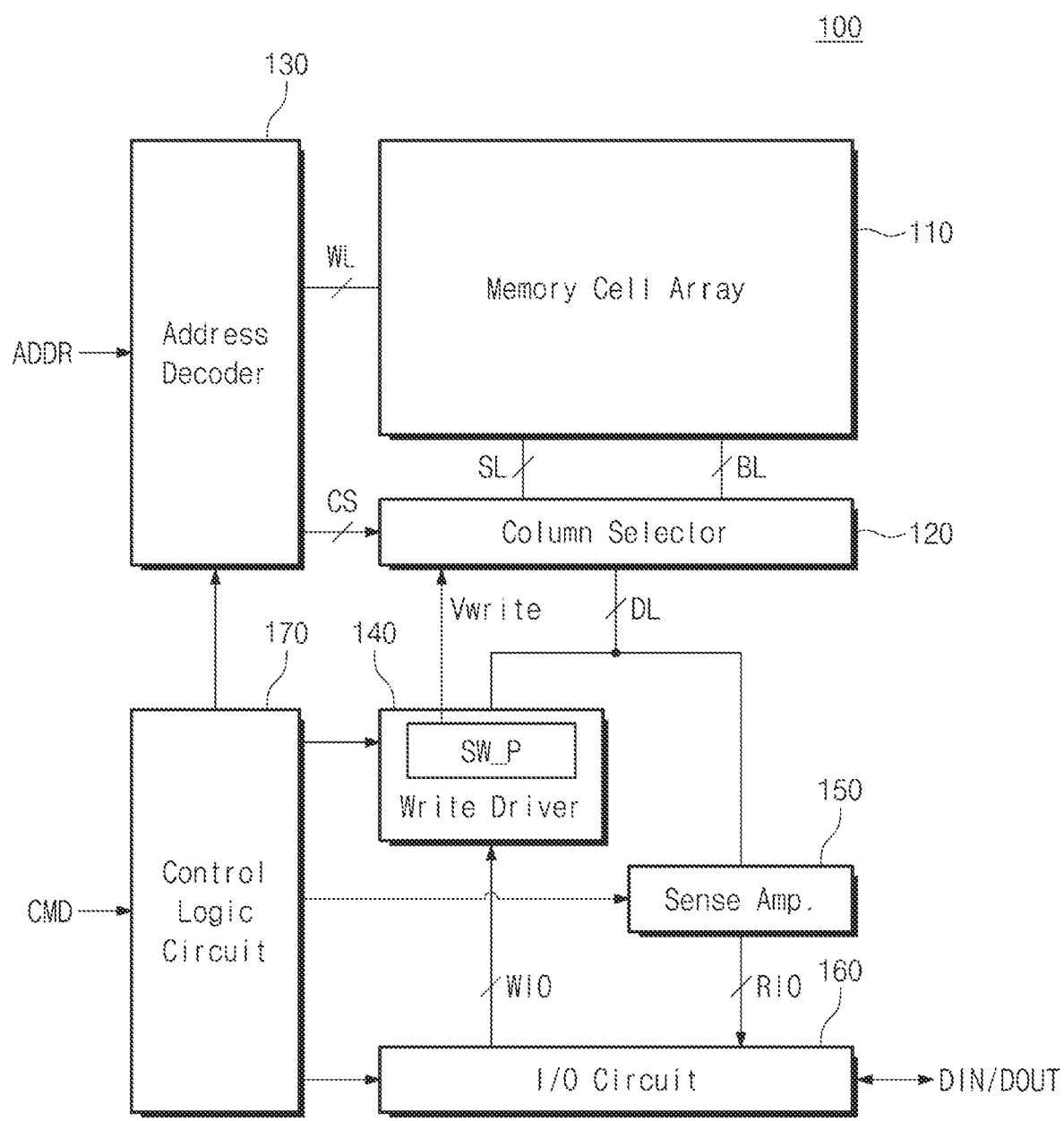
FIG. 1 is a block diagram illustrating a memory device according to some embodiments of the present disclosure.

FIG. 1 is a block diagram illustrating a memory device according to some embodiments of the present disclosure. Referring to FIG. 1, a memory device 100 may include a memory cell array 110, a column selector 120, an address decoder 130, a write driver 140, a sense amplifier 150, an input/output (I/O) circuit 160, and a control logic circuit 170. According to some embodiments, the memory device 100 may be a nonvolatile memory device, and may include nonvolatile memory cells, such as magnetic random access memory (MRAM) cells.

The memory device 100 may include the column selector 120, which may be implemented with transistors that include an oxide of a given thickness or less. As semiconductor manufacturing processes develop, memory devices such as the memory device 100 are being miniaturized. Such miniaturization of memory devices such as the memory device 100 may cause issues in a peripheral circuit as well as in memory cells. The peripheral circuit may include the column selector 120, the address decoder 130, the write driver 140, the sense amplifier 150, the input/output circuit 160, and the control logic circuit 170. In particular, by reducing an oxide thickness of the transistors of the column selector 120 the size of the column selector 120 may be reduced, and as a result the overall size of the memory device 100 may also be reduced.

However, as an oxide thickness of a transistor becomes thinner, a degree of degradation of the transistor due to a gate voltage may become greater. Also, because a write voltage that is greater than or equal to a power supply voltage VDD may be used in the MRAM, there is an increased probability that a latch-up phenomenon may occur in which a current flows through a bulk of a PMOS transistor. Therefore, the memory device 100 according to the present disclosure may prevent or reduce occurrences of such a latch-up phenomenon by applying a write voltage, which may be greater than or equal to a power supply voltage VDD, to a bulk of a PMOS transistor in the write operation, and may prevent the degradation of the PMOS transistor by applying the power supply voltage VDD to the bulk of the PMOS transistor after the write operation is completed.

The memory cell array 110 may include a plurality of memory cells. The plurality of memory cells may be connected with word lines WL, bit lines BL, and source lines SL. Each of the plurality of memory cells may be configured to store data. According to some embodiments, each memory cell may include a variable resistance element, and a value of data stored in each memory cell may be determined based on a resistance value of the variable resistance element. For example, each memory cell may include an MRAM cell, an STT-MRAM (Spin Transfer Torque MRAM) cell, a PRAM (Phase-change RAM) cell, a ReRAM (Resistive RAM) cell, or the like. Below, for convenience of description, it is assumed that each memory cell includes an MRAM cell.

The column selector 120 may be connected with the memory cell array 110 through the bit lines BL and the source lines SL. The column selector 120 may perform selection of the bit lines BL and/or the source lines SL in response to a column select signal CS from the address decoder 130. According to some embodiments, the column selector 120 may include a plurality of column multiplexer circuits. Each of the plurality of column multiplexer circuits may be configured to select a corresponding source line SL and a corresponding bit line BL in response to the column select signal CS. To this end, each of the plurality of column multiplexer circuits may include a plurality of transistors. The plurality of transistors may include an oxide of a given thickness or less. A structure and an operation of a column multiplexer circuit will be described in greater detail with reference to FIGS. 5 and 7.

The address decoder 130 may be connected with the memory cell array 110 through the word lines WL. The address decoder 130 may decode an address ADDR received from an external device (e.g., a memory controller or a host) and may control individual voltages of the word lines WL based on the decoded address. According to some embodiments, the address decoder 130 may provide the column select signal CS to the column selector 120 based on the decoded address ADDR.

The write driver 140 may be connected with the column selector 120 through data lines DL. The write driver 140 may be configured to drive the data lines DL based on write data received through a write input/output line WIO (hereinafter referred to as a "write I/O"). The data lines DL may be connected with bit lines BL or source lines SL that are selected by the column selector 120.

Only the data lines DL are illustrated for brevity of drawing and convenience of description. However, in the following description, it may be understood that the data line DL corresponds to a bit line BL and/or a source line SL selected by the column selector 120. During the write operation of the memory device 100, as the write driver 140 controls voltages of the data lines DL based on write data DIN, the write data DIN may be written in memory cells corresponding to a bit line BL or source line SL selected by the column selector 120. In other words, the write driver 140 may apply a write voltage Vwrite to the bit line BL or source line SL selected by the column selector 120 to write the write data DIN.

According to some embodiments, the write driver 140 may further include a PBULK switch SW_P. The PBULK switch SW_P may apply the write voltage Vwrite to a bulk of the column selector 120 in the write operation. In greater detail, the column selector 120 may include a plurality of PMOS transistors, and the PBULK switch SW_P may apply the write voltage Vwrite to a bulk of the plurality of PMOS transistors of the column selector 120 in response to a write enable signal. The PBULK switch SW_P will be described in greater detail with reference to FIGS. 6A to 6C.

The sense amplifier 150 may be connected with the column selector 120 through the data lines DL. The sense amplifier 150 may output data through read input/output lines RIO, based on a signal received through the data lines DL.

For example, in a read operation of the memory device 100, as the sense amplifier 150 senses a signal provided through the data lines DL, read data DOUT may be read from memory cells corresponding to a bit line BL or source line SL selected by the column selector 120.

The input/output circuit 160 may receive the write data DIN from the external device (e.g., a memory controller or a host) or may output the read data DOUT to the external device.

The control logic circuit 170 may control an operation of the memory device 100 in response to a command CMD (or a control signal) from the external device. For example, in the write operation of the memory device 100, the control logic circuit 170 may activate the write driver 140. Alternatively, in the read operation of the memory device 100, the control logic circuit 170 may activate the sense amplifier 150.

As described above, the memory device 100 may include the column selector 120 implemented with transistors including an oxide of a given thickness or less, and the write driver 140 may be configured to apply the write voltage Vwrite to a bulk of a PMOS transistor. As such, the size of the memory device 100 may be reduced, and the degradation and latch-up of the PMOS transistors included in the column selector 120 of the memory device 100 may be prevented or reduced.

Figure 2:
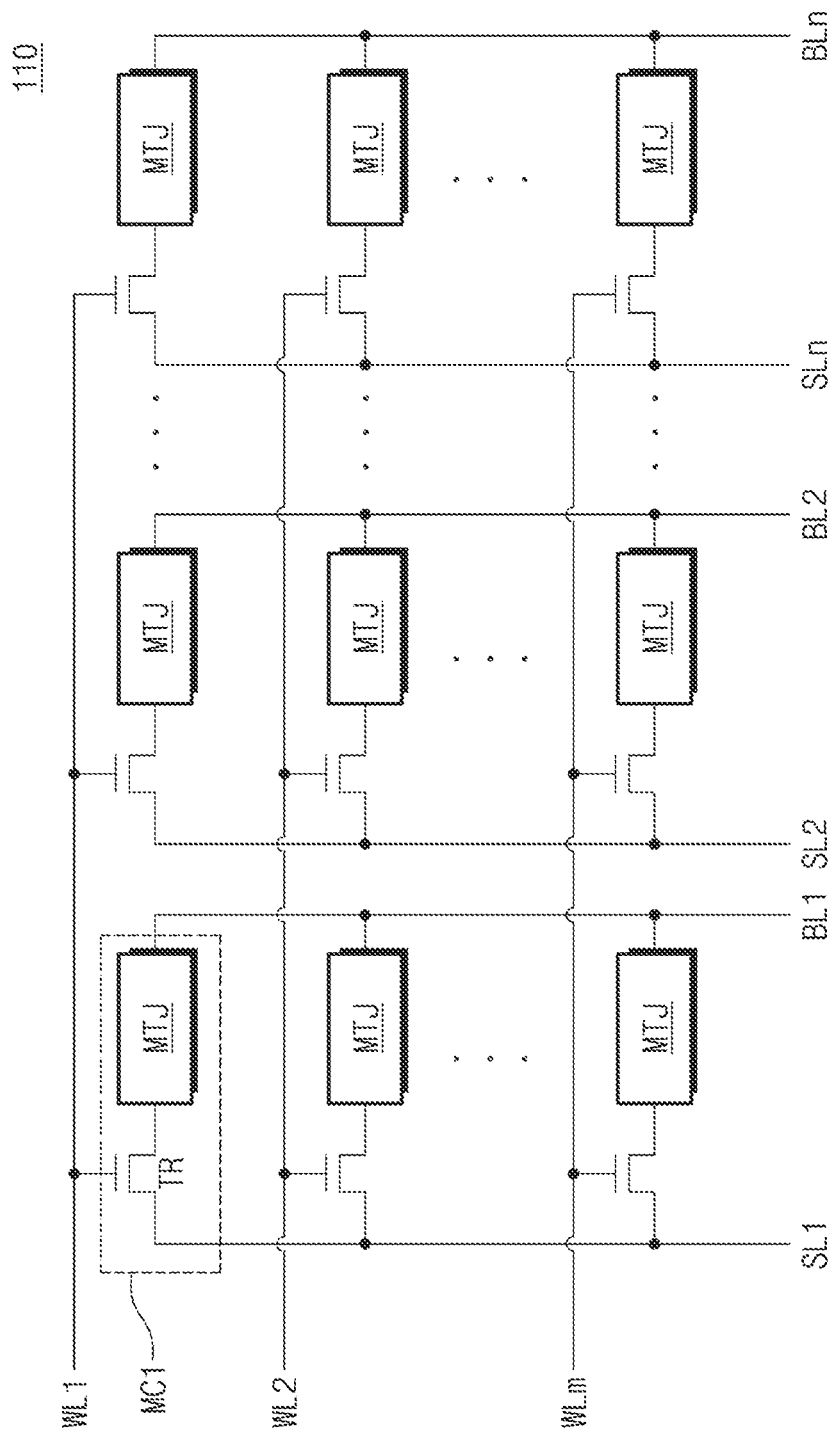
FIG. 2 is a diagram illustrating a memory cell array of FIG. 1.
Figure 3A:
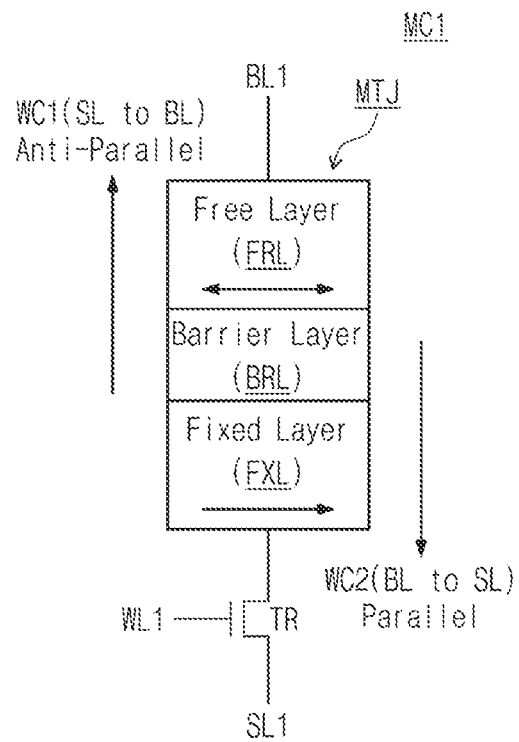
FIGS. 3A to 4 are diagrams for describing a first memory cell of FIG. 2.
Figure 3B:
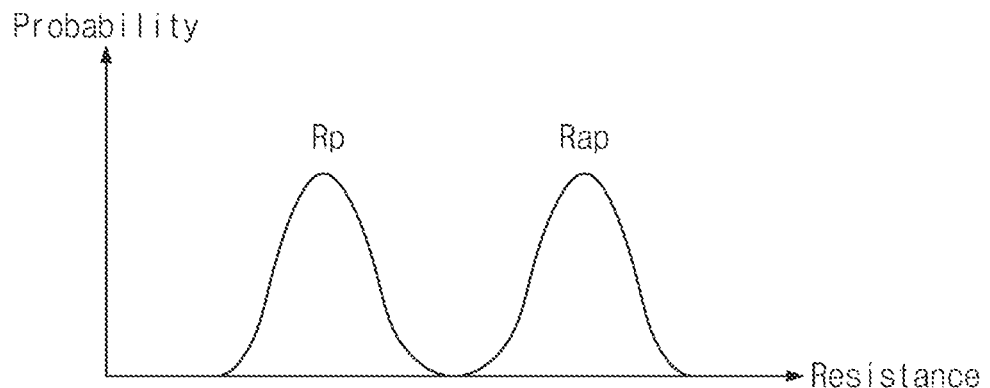
Figure 4:
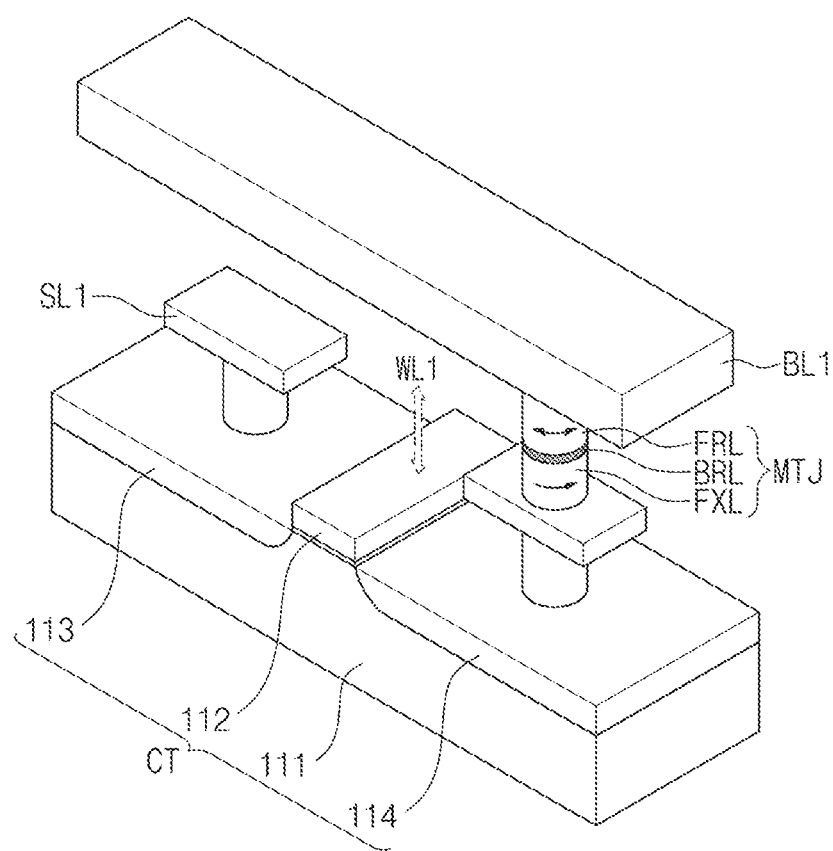

FIG. 2 is a diagram illustrating a memory cell array of FIG. 1. FIGS. 3A to 4 are diagrams for describing a first memory cell of FIG. 2. Referring to FIGS. 1, 2, 3A, 3B, and 4, the memory cell array 110 may include a plurality of memory cells. Each of the plurality of memory cells may be an MRAM cell, and the plurality of memory cells may be connected with word lines WL1 to WLm, bit lines BL1 to BLn, and source lines SL1 to SLn.

For example, a first memory cell MC1 may include an access transistor TR and a variable resistance element MTJ (e.g., a magnetic tunnel junction). A first end of the access transistor TR may be connected with the first source line SL1, a second end of the access transistor TR may be connected with a first end of the variable resistance element MTJ, and a gate of the access transistor TR may be connected with the first word line WL1. A second end of the variable resistance element MTJ may be connected to the first bit line BL1.

Data may be stored in each of the plurality of memory cells by adjusting a resistance value of the variable resistance element MTJ of each memory cell. For example, as illustrated in FIGS. 3A and 4, the variable resistance element MTJ may include a free layer FRL, a barrier layer BRL, and a fixed layer FXL. The barrier layer BRL may be interposed between the free layer FRL and the fixed layer FXL, the free layer FRL may be connected with the first bit line BL1, and the fixed layer FXL may be connected with the second end of the access transistor TR. A magnetization direction of the fixed layer FXL may be fixed to a specific direction, and a magnetization direction of the free layer FRL may be changed according to a specific condition (e.g., a direction of a write current). According to some embodiments, the variable resistance element MTJ may further include an anti-ferromagnetic layer for fixing the magnetization direction of the fixed layer FXL.

The free layer FRL may include a material which has a variable magnetization direction. The magnetization direction of the free layer FRL may be changed by an electrical/magnetic factor provided from outside and/or inside of a memory cell. The free layer FRL may include a ferromagnetic material that contains at least one of cobalt (Co), iron (Fe), and nickel (Ni). For example, the free layer FRL may include at least one selected from FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. However, the present disclosure is not limited to these examples.

A thickness of the barrier layer BRL may be smaller than a spin diffusion distance. The barrier layer BRL may include a non-magnetic material. For example, the barrier layer BRL may include at least one selected from a group of magnesium (Mg), titanium (Ti), aluminum (Al), oxide of magnesium-zinc (MgZn) and magnesium-boron (MgB), and nitride of titanium (Ti) and vanadium (V). However, the present disclosure is not limited to these examples.

The fixed layer FXL may have a magnetization direction pinned by the anti-ferromagnetic layer. The fixed layer FXL may include a ferromagnetic material. For example, the fixed layer FXL may include at least one selected from a group of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. According to some embodiments, the anti-ferromagnetic layer may include an anti-ferromagnetic material. For example, the anti-ferromagnetic layer may include at least one selected from a group of PtMn, IrMn, MnO, MnS, MnTe, $MnF_2$, $FeCl_2$, FeO, $CoCl_2$, CoO, $NiCl_2$, NiO, and Cr. However, the present disclosure is not limited to these examples.

As illustrated in FIG. 3A, the magnetization direction of the free layer FRL may be changed according to a direction of a write current WC1 or WC2 flowing through the variable resistance element MTJ. For example, referring to the first write current WC1 illustrated in FIG. 3A, when a current flows in a direction from the first source line SL1 to the first bit line BL1, the magnetization direction of the free layer FRL may be opposite to the magnetization direction of the fixed layer FXL, which corresponds to an anti-parallel state. Referring to the second write current WC2 illustrated in FIG. 3A, when a current flows in a direction from the first bit line BL1 to the first source line SL1, the magnetization direction of the free layer FRL may be the same as the magnetization direction of the fixed layer FXL, which corresponds to a parallel state.

With reference to FIG. 3B, described in greater detail below, in the case where the variable resistance element MTJ is in the anti-parallel state, the variable resistance element MTJ may have an anti-parallel resistance value Rap. In the case where the variable resistance element MTJ is in the parallel state, the variable resistance element MTJ may have a parallel resistance value Rp. That is, data may be stored in the first memory cell MC1 depending on a resistance value of the variable resistance element MTJ, and the data stored in the first memory cell MC1 may be read by determining the resistance value of the variable resistance element MTJ.

Referring to FIG. 4, the access transistor TR may include a body substrate 111, a gate electrode 112, and junctions 113 and 114. The junction 113 may be formed on the body substrate 111 and may be connected with the first source line SL1. The junction 114 may be formed on the body substrate 111 and may be connected with the first bit line BL1 through the MTJ element. The gate electrode 112 may be formed on the body substrate 111 between the junctions 113 and 114 and may be connected with the first word line WL1.

Figure 5:
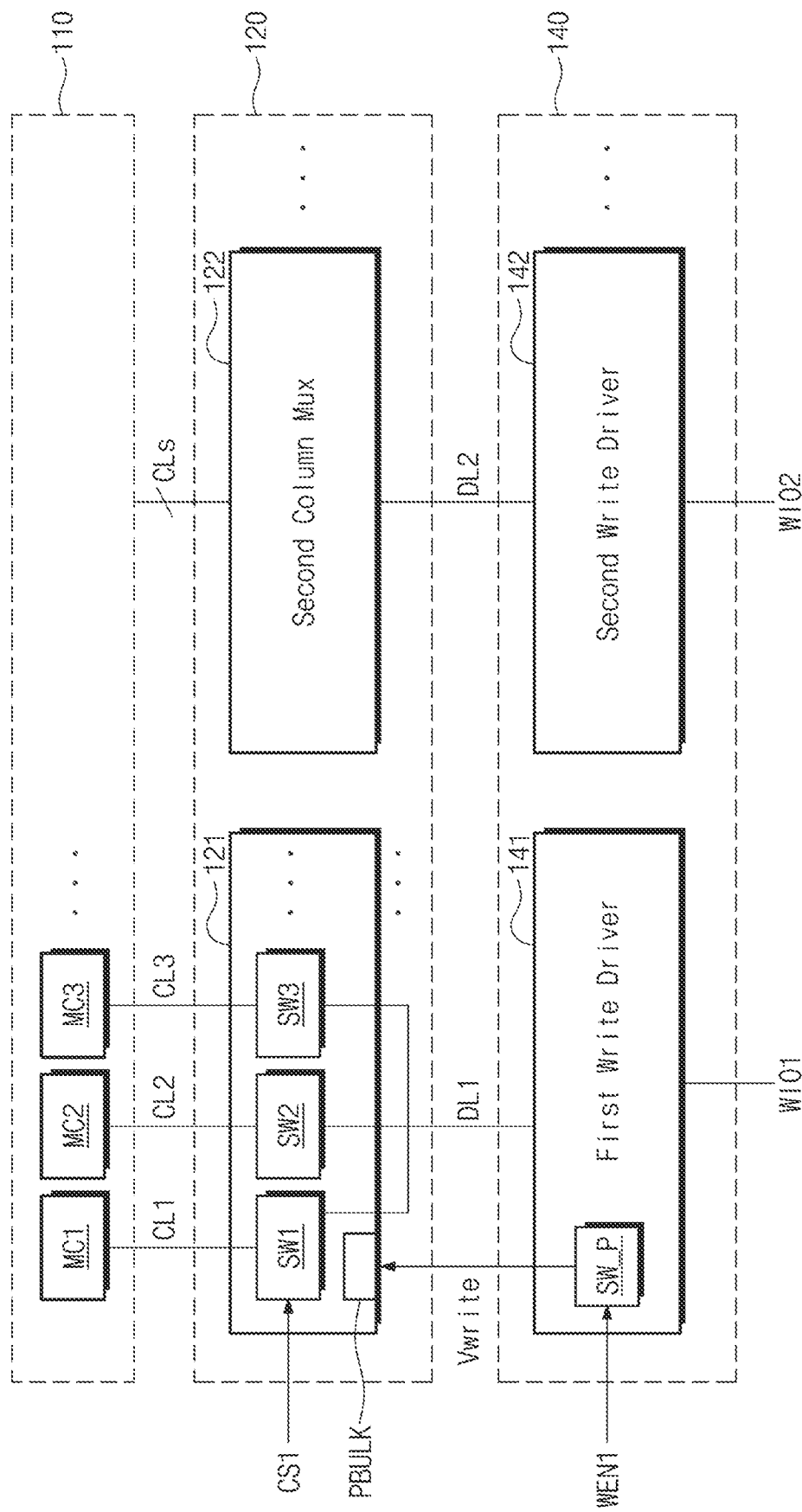
FIG. 5 is a block diagram illustrating a memory device of FIG. 1 in greater detail.

FIG. 5 is a block diagram illustrating a memory device of FIG. 1 in greater detail. Below, to explain the inventive concepts and/or technical features of the present disclosure more easily, embodiments of the present disclosure will be described based on a write operation of the memory device 100. That is, some components (e.g., the sense amplifier 150) that are unrelated to the write operation of the memory device 100 may be omitted in the following drawings and from the description thereof, with the understanding that the present disclosure is not limited thereto.

Referring to FIGS. 1 and 5, the memory device 100 may include the memory cell array 110, the column selector 120, and the write driver 140. The memory cell array 110 may include first to third memory cells MC1, MC2, and MC3 connected respectively with first to third column lines CL1, CL2, and CL3. A column line CL may include a source line SL and a bit line BL. For example, the first column line CL1 may include the first source line SL1 and the first bit line BL1. According to some embodiments, each of the first to third memory cells MC1, MC2, and MC3 may be the first memory cell MC1 described with reference to FIG. 3A. For convenience of description, three memory cells MC and three column lines CL are illustrated by way of example, but the number of memory cells MC and the number of column lines CL are not limited thereto.

The column selector 120 may include a plurality of column multiplexer circuits. For example, the plurality of column multiplexer circuits may include first and second column multiplexer circuits 121 and 122 respectively connected with first and second data lines DL1 and DL2. The first column multiplexer circuit 121 may be connected through column lines CL with at least a part of the plurality of memory cells MC included in the memory cell array 110. For example, the first column multiplexer circuit 121 may be connected to the first to the third memory cells MC1, MC2, and MC3 of the memory cell array 110 through the first to third column lines CL1, CL2, and CL3.

The first column multiplexer circuit 121 may select one of the first to third column lines CL1, CL2, and CL3 in response to a first column select signal CS1. For example, the first column multiplexer circuit 121 may select the first column line CL1 by connecting the first data line DL1 and the first column line CL1 in response to the first column select signal CS1.

The first column multiplexer circuit 121 may include first to third switches SW1, SW2, and SW3 and a bulk port PBULK. In each column multiplexer circuit, the number of switches may correspond to the number of column lines. The first switch SW1 may be turned on the first column select signal CS1 and may be turned off in response to an inverted signal (or an inverted version) of the first column select signal CS1. When the first switch SW1 is turned on, the first column line CL1 and the first data line DL1 may be electrically connected. The first switch SW1 may include a plurality of NMOS transistors and a plurality of PMOS transistors. An oxide of the plurality of PMOS transistors may be a given thickness or less. Below, a configuration of the first switch SW1 will be described in greater detail with reference to FIG. 7.

The second switch SW2 and the third switch SW3 are similar to the first switch SW1, and thus, additional description will be omitted to avoid redundancy. However, when the second switch SW2 is turned on, the second column line CL2 and the first data line DL1 may be electrically connected; when the third switch SW3 is turned on, the third column line CL3 and the first data line DL1 may be electrically connected.

The bulk port PBULK may be electrically connected with bulks of the PMOS transistors included in the first column multiplexer circuit 121. An example is illustrated in FIG. 5 as the first column multiplexer circuit 121 includes only one bulk port PBULK, but the present disclosure is not limited thereto. For example, a bulk port PBULK may be respectively provided for each of the first to third switches SW1, SW2, and SW3. In the example of FIG. 5, the bulk port PBULK may be electrically connected with bulks of PMOS transistors included in each switch.

According to some embodiments, the PMOS transistors included in each switch may share an n-well being a bulk; when the write voltage Vwrite is applied to the bulk port PBULK, the write voltage Vwrite may be applied to the n-well of each switch. According to some embodiments, the power supply voltage VDD may be applied to the n-well of each switch through the bulk port PBULK.

Although not illustrated in FIG. 5, the second column multiplexer circuit 122 may include a plurality of switches and a bulk port, and because the second column multiplexer circuit 122 is similar to the first column multiplexer circuit 121, additional description will be omitted to avoid redundancy.

The write driver 140 may include a first write driver 141 and a second write driver 142. The first write driver 141 may be connected with the first column multiplexer circuit 121 through the first data line DL1. The first write driver 141 may receive the write data DIN from the first write I/O WIO1, and may apply a parallel reference voltage REF_P or an anti-parallel reference voltage REF_AP (see FIGS. 6A to 6C) to the first data line DL1 based on the write data DIN.

For example, when the write data DIN are data "1", the first write driver 141 may apply the anti-parallel reference voltage REF_AP corresponding to the anti-parallel state of the first memory cell MC1 described with reference to FIG. 3A. For example, when the write data DIN are data "0", the first write driver 141 may apply the parallel reference voltage REF_P corresponding to the parallel state of the first memory cell MC1 described with reference to FIG. 3A.

The first write driver 141 may further include the PBULK switch SW_P. The PBULK switch SW_P may be electrically connected with the bulk port PBULK. The PBULK switch SW_P may apply the write voltage Vwrite to the bulk port PBULK in response to a write enable signal WEN1. For example, the write voltage Vwrite may be the parallel reference voltage REF_P or the anti-parallel reference voltage REF_AP.

The second write driver 142 may be connected with the second column multiplexer circuit 122 through the second data line DL2. The second write driver 142 may receive the write data DIN from a second write I/O WIO2. Although not illustrated in FIG. 5, the second write driver 142 may further include a PBULK switch. The second write driver 142 may apply a write voltage to the second column multiplexer circuit 122 in the write operation. In greater detail, the write voltage may be applied to an n-well shared by the PMOS transistors included in the second column multiplexer circuit 122. The second write driver 142 is similar to the first write driver 141, and thus, additional description will be omitted to avoid redundancy.

The components of FIG. 5 discussed above are to describe the inventive concepts and/or technical ideas of the present disclosure easily, and the present disclosure is not limited to embodiments having the exact components illustrated in FIG. 5. For example, some of the components illustrated in FIG. 5 may be omitted, or any components not illustrated to FIG. 5 may be added thereto.

Figure 6A:
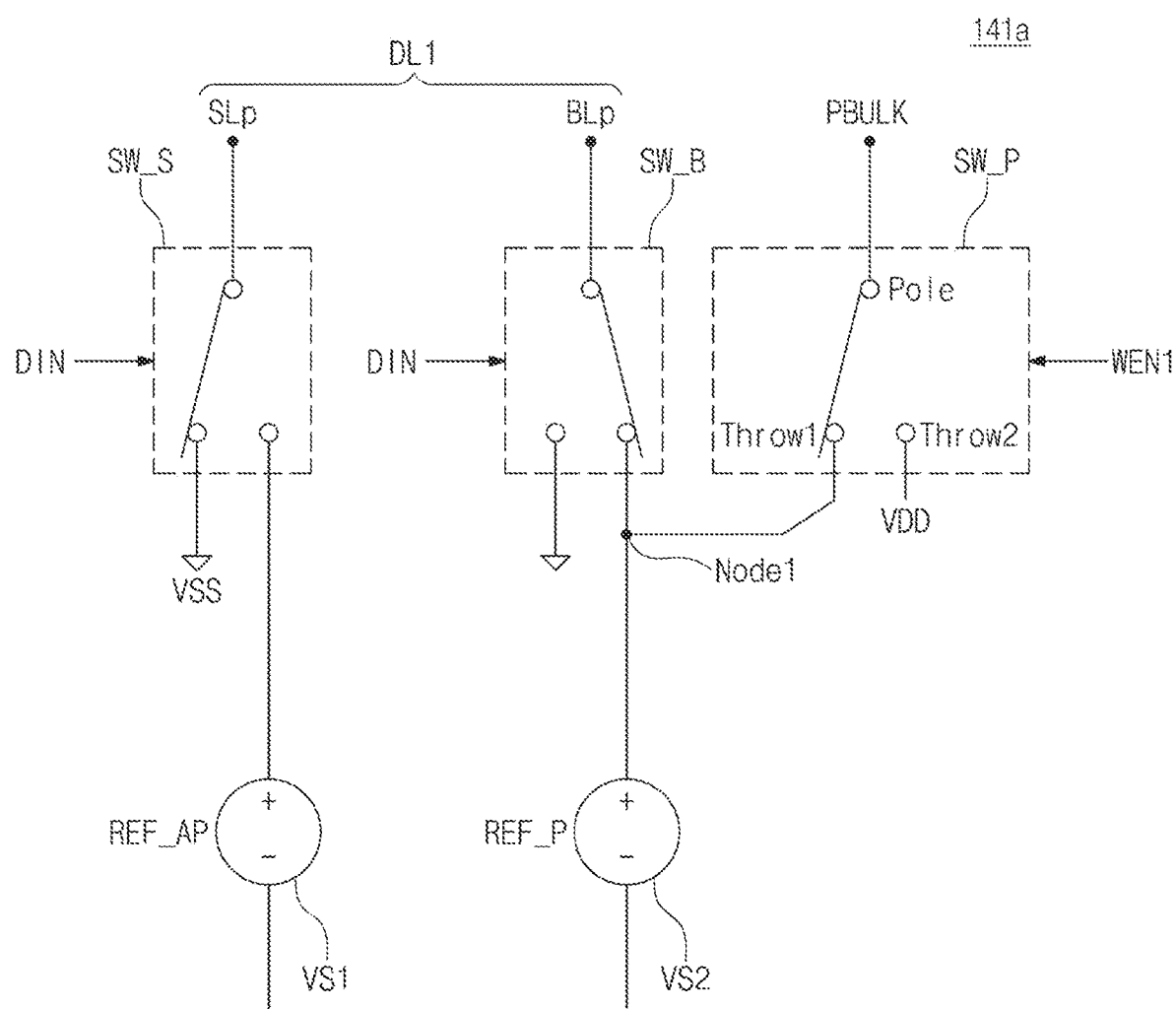
FIGS. 6A to 6C are diagrams for describing an operation of a first write driver of FIG. 5.
Figure 6B:
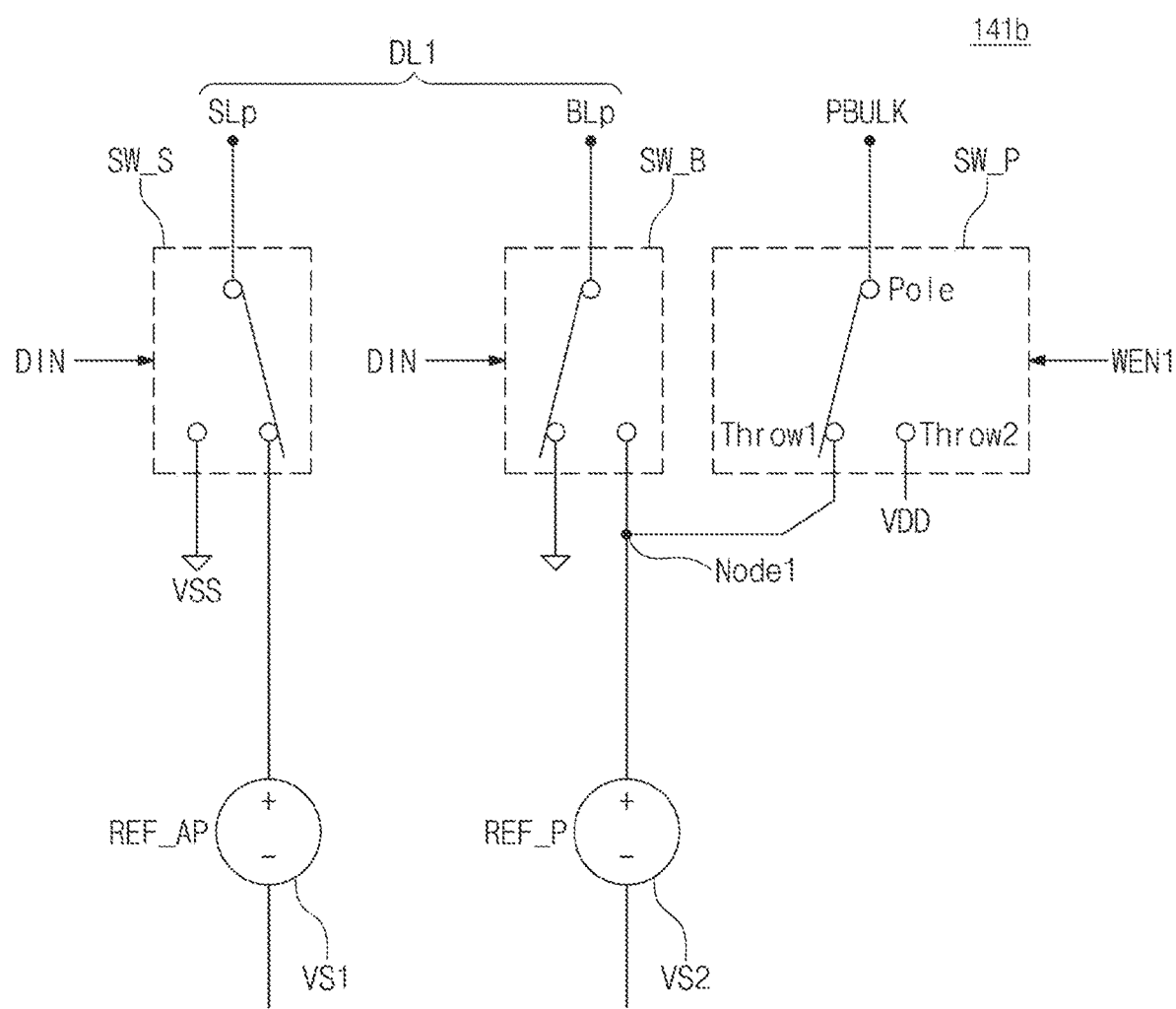
Figure 6C:
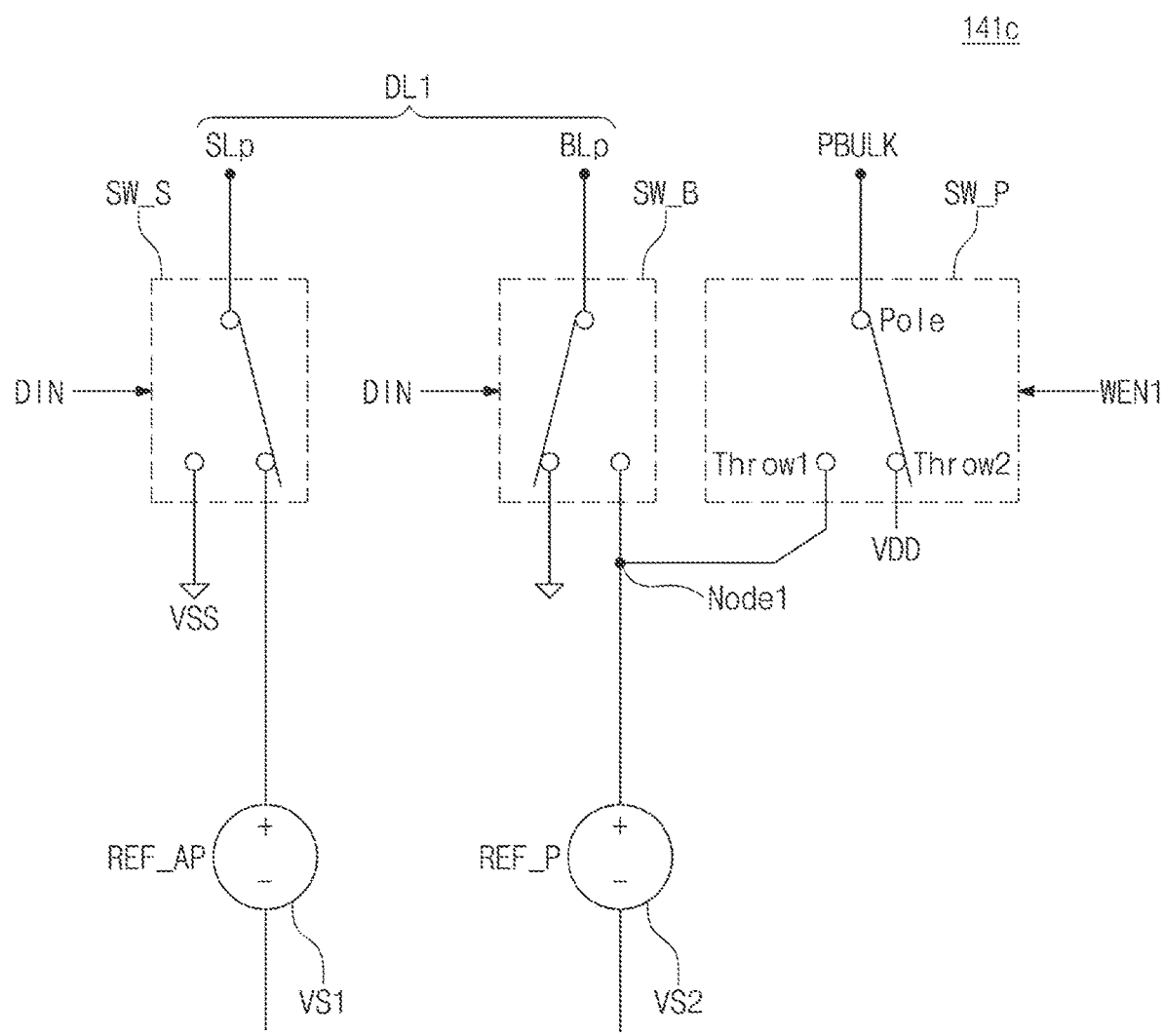

FIGS. 6A to 6C are diagrams for describing an operation of a first write driver of FIG. 5. FIGS. 6A and 6B are diagrams for describing a write operation of a first write driver, and FIG. 6C is a diagram for describing a read operation of the first write driver. Referring to FIGS. 1, 5, 6A, and 6B, a first write driver 141a/141b may include a source line switch SW_S, a bit line switch SW_B, the PBULK switch SW_P, an anti-parallel reference voltage source VS1, and a parallel reference voltage source VS2.

The first write driver 141a/141b may output at least one of the parallel reference voltage REF_P, the anti-parallel reference voltage REF_AP, and a ground voltage VSS to the first data line DL1. The first data line DL1 may include a peripheral circuit source line SLp and a peripheral circuit bit line BLp. The anti-parallel reference voltage REF_AP or the ground voltage VSS that is applied to the peripheral circuit source line SLp may be provided to the first source line SL1 through the first column multiplexer circuit 121. The parallel reference voltage REF_P or the ground voltage VSS that is applied to the peripheral circuit bit line BLp may be provided to the first bit line BL1 through the first column multiplexer circuit 121.

The source line switch SW_S may be a switch of a single pole double throw (SPDT) type configured to select a voltage to be applied to the peripheral circuit source line SLp. The source line switch SW_S may select between the ground voltage VSS and the anti-parallel reference voltage REF_AP in response to the write data DIN.

For example, as illustrated in FIG. 6A, the write data DIN may be data "0,", and the source line switch SW_S may be configured to select the ground voltage VSS in response to data "0." As such, the ground voltage VSS may be applied to the peripheral circuit source line SLp. As illustrated in FIG. 6B, the write data DIN may be data "1," and the source line switch SW_S may be configured to select the anti-parallel reference voltage REF_AP in response to data "1." As such, the anti-parallel reference voltage REF_AP may be applied to the peripheral circuit source line SLp.

The anti-parallel reference voltage source VS1 may generate the anti-parallel reference voltage REF_AP. The anti-parallel reference voltage source VS1 may apply the generated anti-parallel reference voltage REF_AP to the source line switch SW_S.

The bit line switch SW_B may be a switch of an SPDT type configured to select a voltage to be applied to the peripheral circuit bit line BLp. The bit line switch SW_B may select between the ground voltage VSS and the parallel reference voltage REF_P in response to the write data DIN.

For example, as illustrated in FIG. 6A, the write data DIN may be data "0," and the bit line switch SW_B may select the parallel reference voltage REF_P in response to data "0." As such, the parallel reference voltage REF_P may be applied to the peripheral circuit bit line BLp. As illustrated in FIG. 6B, the write data DIN may be data "1," and the bit line switch SW_B may select the ground voltage VSS in response to data "1." As such, the ground voltage VSS may be applied to the peripheral circuit bit line BLp.

The parallel reference voltage source VS2 may generate the parallel reference voltage REF_P. The parallel reference voltage source VS2 may apply the generated parallel reference voltage REF_P to the bit line switch SW_B. According to some embodiments, the parallel reference voltage source VS2 may be connected with the bit line switch SW_B through a first node Node1.

The PBULK switch SW_P may be a switch of an SPDT type configured to select a voltage to be applied to the bulk port PBULK. The PBULK switch SW_P may select between the power supply voltage VDD and the parallel reference voltage REF_P in response to a write enable signal. The PBULK switch SW_P may be connected with the parallel reference voltage source VS2 through the first node Node1.

According to some embodiments, the PBULK switch SW_P may be configured to select the parallel reference voltage REF_P in response to a first write enable signal WEN1 of a high level. That is, the PBULK switch SW_P may be connected with the first node Node1 in response to the first write enable signal WEN1 of the high level. As such, the parallel reference voltage REF_P may be applied to the bulk port PBULK. According to some embodiments, the first write enable signal WEN1 of the high level may be a signal that the control logic circuit 170 generates based on a write command CMD.

According to some embodiments, the PBULK switch SW_P may include a pole, a first throw Throw1, and a second throw Throw2. The pole may be connected with the bulk port PBULK, the first throw Throw1 may be connected with the first node Node1, and the second throw Throw2 may be connected with a power supply voltage terminal. The PBULK switch SW_P may connect the pole and the first throw Throw1 in response to the first write enable signal WEN1 of the high level. When the pole and the first throw Throw1 are connected, the parallel reference voltage REF_P may be applied to the bulk port PBULK.

Referring to FIGS. 1, 5, and 6A to 6C, a first write driver 141c may include the source line switch SW_S, the bit line switch SW_B, the PBULK switch SW_P, the anti-parallel reference voltage source VS1, and the parallel reference voltage source VS2. The source line switch SW_S, the bit line switch SW_B, the PBULK switch SW_P, the anti-parallel reference voltage source VS1, and the parallel reference voltage source VS2 of FIG. 6C may be similar to those of FIG. 6B, and thus, additional description will be omitted to avoid redundancy.

As seen in FIG. 6C, the PBULK switch SW_P may select the power supply voltage VDD in response to the first write enable signal WEN1 of a low level. That is, the PBULK switch SW_P may be disconnected from the first node Node1 in response to the first write enable signal WEN1 of the low level. As such, the power supply voltage VDD may be applied to the bulk port PBULK. According to some embodiments, the first write enable signal WEN1 of the low level may be a signal that the control logic circuit 170 generates based on a completion of the write command CMD. For example, the first write enable signal WEN1 of the low level may be a signal that the control logic circuit 170 generates based on a read operation command or a standby command.

According to some embodiments, the PBULK switch SW_P may connect the pole and the second throw Throw2 in response to the first write enable signal WEN1 of the low level. When the pole and the second throw Throw2 are connected, the power supply voltage VDD may be applied to the bulk port PBULK.

As described above, the first write driver 141a/141b/141c may be configured to apply selectively the write voltage Vwrite or the power supply voltage VDD to the bulk port PBULK based on the first write enable signal WEN1. In some embodiments, the write voltage Vwrite may include the parallel reference voltage REF_P or the anti-parallel reference voltage REF_AP. For example, an embodiment in which the PBULK switch SW_P is connected with the parallel reference voltage source VS2 under the assumption that the parallel reference voltage REF_P is greater in magnitude than the anti-parallel reference voltage REF_AP is described with reference to FIGS. 6A to 6C. However, the present disclosure is not limited thereto. For example, in the case where the anti-parallel reference voltage REF_AP is greater in magnitude than the parallel reference voltage REF_P, the PBULK switch SW_P (e.g., the first throw Throw1) may be connected with the anti-parallel reference voltage source VS1. In other words, a reference voltage having a relatively great magnitude selected from among the parallel reference voltage REF_P and the anti-parallel reference voltage REF_AP may be applied to the bulk port PBULK as the write voltage Vwrite in the write operation.

Also, the power supply voltage VDD may be applied to the bulk port PBULK based on the first write enable signal WEN1 of the low level. That is, the memory device 100 may apply the power supply voltage VDD to a bulk(s) of PMOS transistors in the remaining operations other than the write operation. Accordingly, the memory device 100 may prevent the degradation of PMOS transistors due to the write voltage Vwrite greater than the power supply voltage VDD.

Figure 7:
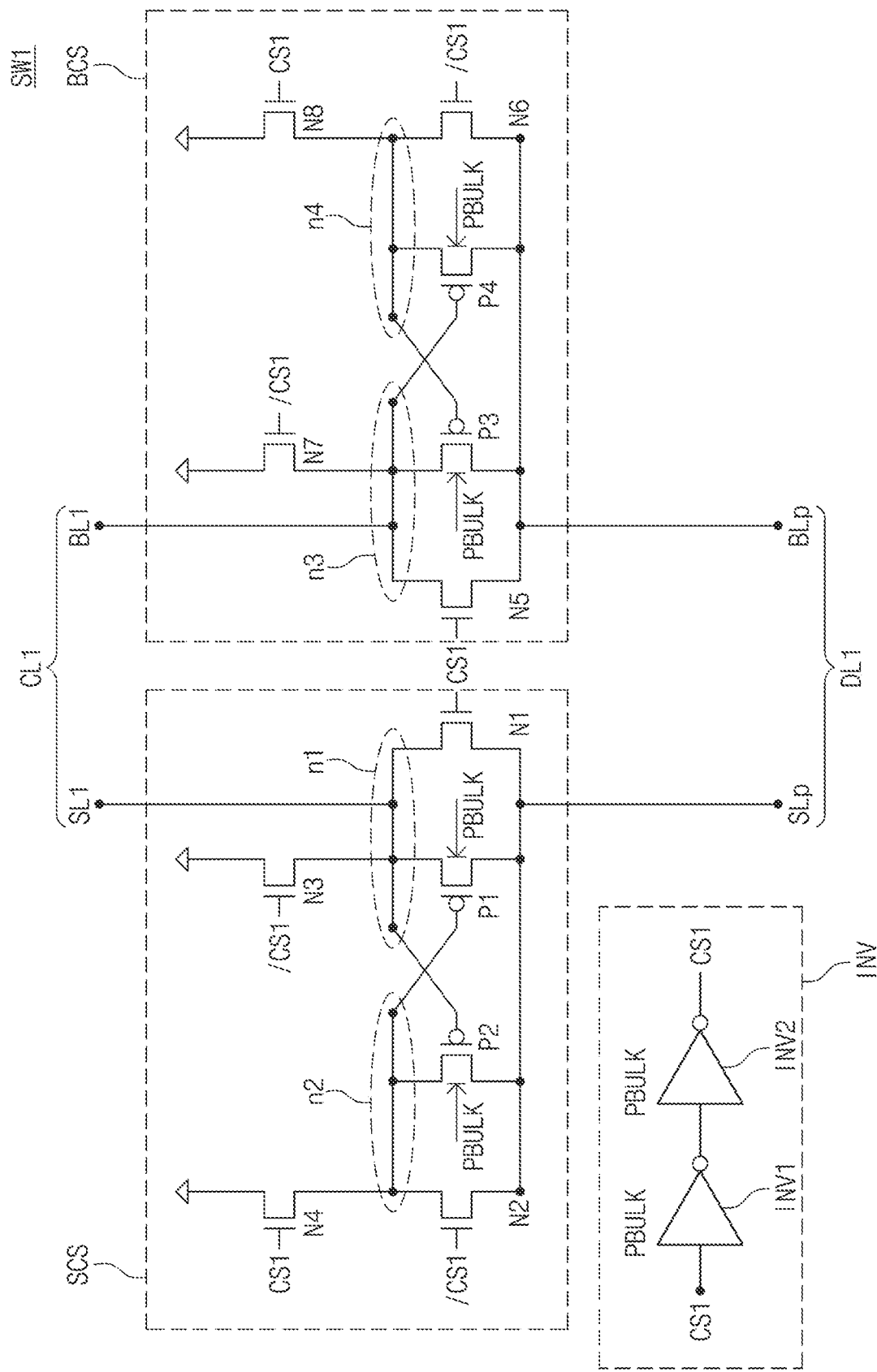
FIG. 7 is a circuit diagram illustrating a first switch of FIG. 5 in greater detail.
Figure 8:
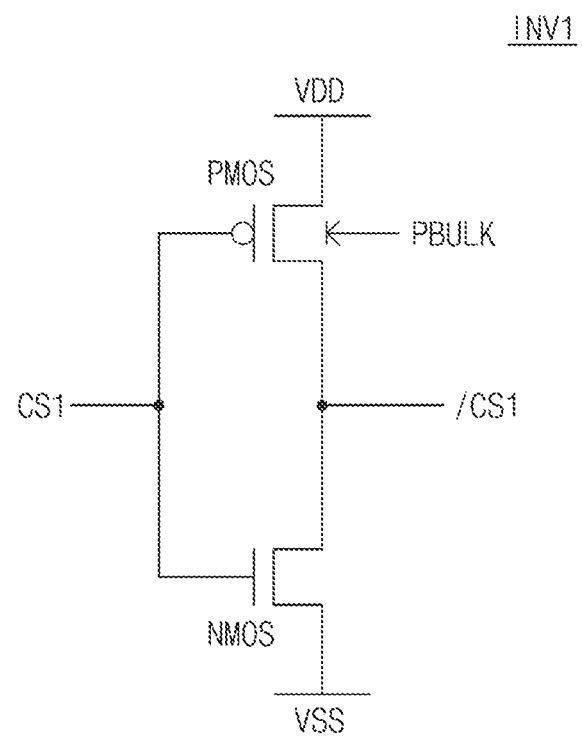
FIG. 8 is a circuit diagram illustrating a first inverter of FIG. 7.

FIG. 7 is a circuit diagram illustrating a first switch of FIG. 5 in more detail. FIG. 8 is a circuit diagram illustrating a first inverter of FIG. 7. Referring to FIGS. 5, 7, and 8, the first switch SW1 may include an inverter INV, a source line selecting switch SCS, and a bit line selecting switch BCS. Below, for convenience of description, it is assumed that the first column multiplexer circuit 121 selects the first column line CL1 in response to the first column select signal CS1, but the present disclosure is not limited thereto.

The inverter INV may include a first inverter INV1 and a second inverter INV2. The first inverter INV1 may receive the first column select signal CS1 and may output a first inverted column select signal /CS1. The first inverted column select signal /CS1 may be an inverted signal (or inverted version) of the first column select signal CS1. The second inverter INV2 may invert the first inverted column select signal /CS1 and may output the first column select signal CS1. The first column select signal CS1 may be an inverted signal (or inverted version) of the first inverted column select signal /CS1.

According to some embodiments, the first inverter INV1 may include a CMOS inverter. Referring to FIG. 8, the first inverter INV1 may include a PMOS transistor PMOS and an NMOS transistor NMOS. The power supply voltage VDD may be applied to a source of the PMOS transistor PMOS, and the first column select signal CS1 may be applied to a gate of the PMOS transistor PMOS. A drain of the PMOS transistor PMOS may be connected with a drain of the NMOS transistor NMOS. The ground voltage VSS may be applied to a source of the NMOS transistor NMOS, and the first column select signal CS1 may be applied to a gate of the NMOS transistor NMOS.

For example, when the first column select signal CS1 is at the high level, the PMOS transistor PMOS may be turned off, and the NMOS transistor NMOS may be turned on. As such, the ground voltage VSS corresponding to the low level may be output to the drain of the NMOS transistor NMOS. For example, when the first column select signal CS1 is at the low level, the PMOS transistor PMOS may be turned on, and the NMOS transistor NMOS may be turned off. As such, the power supply voltage VDD corresponding to the high level may be output to the drain of the PMOS transistor PMOS. That is, an output signal of the first inverter INV1 may output the first inverted column select signal /CS1 being an inverted signal of the first column select signal CS1.

Returning to FIG. 7, the second inverter INV2 may include a CMOS inverter. Although not illustrated in drawings, the second inverter INV2 may be similar to the first inverter INV1, and thus, additional description will be omitted to avoid redundancy.

The source line selecting switch SCS may be connected with the peripheral circuit source line SLp of the first data line DL1 and the first source line SL1 of the first column line CL1. When the source line selecting switch SCS is turned on, a write voltage applied to the peripheral circuit source line SLp may be transferred to the first source line SL1. The source line selecting switch SCS may be turned on or turned off based on the first column select signal CS1 and the first inverted column select signal /CS1.

The source line selecting switch SCS may include first to fourth NMOS transistors N1, N2, N3, and N4 and first and second PMOS transistors P1 and P2. A first end of the first NMOS transistor N1 may be connected with the peripheral circuit source line SLp, and a second end of the first NMOS transistor N1 may be connected with the first source line SL1 through a first node n1. A gate of the first NMOS transistor N1 may receive the first column select signal CS1 from the inverter INV.

A first end of the second NMOS transistor N2 may be connected with the peripheral circuit source line SLp, and a second end of the second NMOS transistor N2 may be connected with a first end of the fourth NMOS transistor N4 through a second node n2. A gate of the second NMOS transistor N2 may receive the first inverted column select signal /CS1 from the inverter INV.

A first end of the third NMOS transistor N3 may be connected with a second end of the first PMOS transistor P1 through the first node n1, and a second end of the third NMOS transistor N3 may be connected with a ground terminal. A gate of the third NMOS transistor N3 may receive the first inverted column select signal /CS1 from the inverter INV.

The first end of the fourth NMOS transistor N4 may be connected with the second end of the second NMOS transistor N2 through the second node n2, and a second end of the fourth NMOS transistor N4 may be connected with the ground terminal. A gate of the fourth NMOS transistor N4 may receive the first column select signal CS1 from the inverter INV.

A first end of the first PMOS transistor P1 may be connected with the peripheral circuit source line SLp, and the second end of the first PMOS transistor P1 may be connected with the first end of the third NMOS transistor N3 through the first node n1. A gate of the first PMOS transistor P1 may be connected with the second node n2.

A first end of the second PMOS transistor P2 may be connected with the peripheral circuit source line SLp, and a second end of the second PMOS transistor P2 may be connected with the first end of the fourth NMOS transistor N4 through the second node n2. A gate of the second PMOS transistor P2 may be connected with the first node n1.

When the first column select signal CS1 is at the high level, the first NMOS transistor N1 and the fourth NMOS transistor N4 may be turned on, the second NMOS transistor N2 and the third NMOS transistor N3 may be turned off, the first PMOS transistor P1 may be turned on, and the second PMOS transistor P2 may be turned off. As a result, the peripheral circuit source line SLp may be connected with the first source line SL1 through the first NMOS transistor N1 and the first PMOS transistor P1. In this case, a write voltage may be transferred to the first source line SL1.

When the first column select signal CS1 is at the low level, the first NMOS transistor N1 and the fourth NMOS transistor N4 may be turned off, the second NMOS transistor N2 and the third NMOS transistor N3 may be turned on, the first PMOS transistor P1 may be turned off, and the second PMOS transistor P2 may be turned on. As a result, the ground voltage VSS may be transferred to the first source line SL1 through the third NMOS transistor N3.

The bit line selecting switch BCS may be connected with the peripheral circuit bit line BLp of the first data line DL1 and the first bit line BL1 of the first column line CL1. When the bit line selecting switch BCS is turned on, a write voltage applied to the peripheral circuit bit line BLp may be transferred to the first bit line BL1. The bit line selecting switch BCS may be turned on or turned off based on the first column select signal CS1 and the first inverted column select signal /CS1.

The bit line selecting switch BCS may include fifth to eighth NMOS transistors N5, N6, N7, and N8 and third and fourth PMOS transistors P3 and P4. The bit line selecting switch BCS may be symmetrical to the source line selecting switch SCS in structure. Except for this structural difference, the fifth to eighth NMOS transistors N5, N6, N7, and N8 are similar to the first to fourth NMOS transistors N1, N2, N3, and N4, and the third and fourth PMOS transistors P3 and P4 are similar to the first and second PMOS transistors P1 and P2. Thus, additional description will be omitted to avoid redundancy.

As a result, when the first column select signal CS1 is at the high level, the peripheral circuit bit line BLp may be connected with the first bit line BL1 through the fifth NMOS transistor N5 and the third NMOS transistor P3. In this case, a write voltage may be transferred to the first bit line BL1. When the first column select signal CS1 is at the low level, the ground voltage VSS may be transferred to the first bit line BL1 through the seventh NMOS transistor N7.

As described above, each of the inverter INV, the source line selecting switch SCS, and the bit line selecting switch BCS may include one or more NMOS transistors and one or more PMOS transistors. According to some embodiments, the one or more PMOS transistors may include an oxide having a thickness of a given value or less.

According to some embodiments, the one or more PMOS transistors may be formed on a single n-well. For example, in FIGS. 7 and 8, the first to fourth PMOS transistors P1, P2, P3, and P4, the PMOS transistor PMOS of the first inverter INV1, and the PMOS transistor (not illustrated) of the second inverter INV2 may share an n-well.

According to some embodiments, the bulk port PBULK may be electrically connected with the single n-well shared by the one or more PMOS transistors. Referring to FIGS. 6A to 6C, the first write drivers 141a and 141b may apply the write voltage Vwrite to the n-well through the bulk port PBULK in response to the first write enable signal WEN1 of the high level, and the first write driver 141c may apply the power supply voltage VDD to the n-well through the bulk port PBULK in response to the first write enable signal WEN1 of the low level.

The configurations of the source line selecting switch SCS and the bit line selecting switch BCS are not limited to FIG. 7. For example, the source line selecting switch SCS may include the first NMOS transistor N1, the third NMOS transistor N3, and the first PMOS transistor P1, and the bit line selecting switch BCS may include the fifth NMOS transistor N5, the seventh NMOS transistor N7, and the third PMOS transistor P3.

Figure 9:
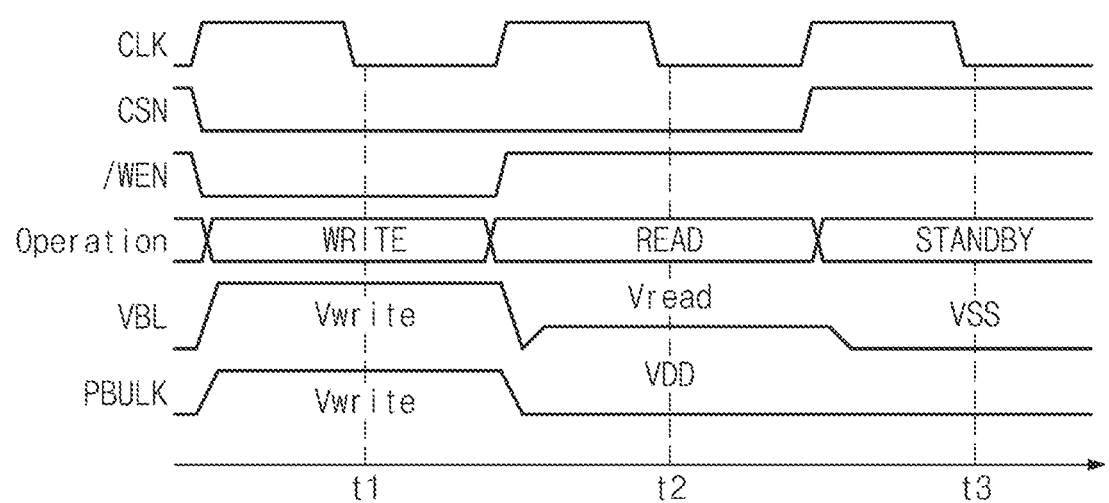
FIG. 9 is a timing diagram for describing an operation of a memory device of FIG. 5.

FIG. 9 is a timing diagram for describing an operation of a memory device of FIG. 5. Referring to FIGS. 1, 5 to 7, and 9, the memory device 100 may receive a clock CLK, a chip select inversion signal CSN, and a write enable inversion signal /WEN from an external device (e.g., a memory controller or a host).

The memory device 100 may perform the write operation or the read operation in response to the chip select inversion signal CSN of the low level. According to some embodiments, the memory device 100 may perform the write operation in response to the write enable inversion signal /WEN of the low level. For example, the control logic circuit 170 may generate a first write enable signal WEN1 in response to the write enable inversion signal /WEN of the low level. According to some embodiments, the first write enable signal WEN1 may be generated in synchronization with the clock CLK provided from the external device. For example, the first write enable signal WEN1 may transition to the high level in response to the write enable inversion signal /WEN of the low level and may transition to the low level at a rising edge of the clock CLK.

For a brief description, the memory device 100 may perform the write operation at a first time t1. To write data "0" in a first memory cell, the write operation may include an operation of generating the first column select signal CS1 of the high level and an operation of applying the write voltage Vwrite to the first bit line BL1.

At the first time t1, the chip select inversion signal CSN may be at the low level, and the write enable inversion signal /WEN may be at the low level. The first write enable signal WEN1 may have the high level based on the write enable inversion signal /WEN of the low level. A bit line voltage VBL may be set to the write voltage Vwrite. According to some embodiments, the write voltage Vwrite may be the parallel reference voltage REF_P for writing data "0."

According to some embodiments, at the first time t1, because the first write enable signal WEN1 is at the high level, the write voltage Vwrite applied to the first bit line BL1 may be transferred to the bulk port PBULK. That is, the parallel reference voltage REF_P may be applied to the n-well of the first switch SW1 through the bulk port PBULK.

The memory device 100 may perform the read operation at a second time t2. To read data "0" from the first memory cell, the read operation may include an operation of generating the first column select signal CS1 of the high level and an operation of applying a read voltage Vread to the first bit line BL1.

At the second time t2, the chip select inversion signal CSN may be at the low level, and the write enable inversion signal /WEN may be at the high level. The first write enable signal WEN1 may have the low level based on the write enable inversion signal /WEN of the high level. Because the first write enable signal WEN1 is at the low level, the power supply voltage VDD may be transferred to the bulk port PBULK. That is, the power supply voltage VDD may be applied to the n-well of the first switch SW1 through the bulk port PBULK. The bit line voltage VBL may be set to the read voltage Vread.

The memory device 100 may perform a standby operation at a third time t3. The standby operation may be an operation after the write operation or the read operation is completed. At the third time t3, the chip select inversion signal CSN may be at the high level, and the write enable inversion signal /WEN may be at the high level. The bit line voltage VBL may be set to the ground voltage VSS based on the chip select inversion signal CSN of the high level. Also, the power supply voltage VDD may be transferred to the bulk port PBULK based on the write enable inversion signal /WEN of the high level. That is, the power supply voltage VDD may be applied to the n-well of the first switch SW1 through the bulk port PBULK.

Figure 10:
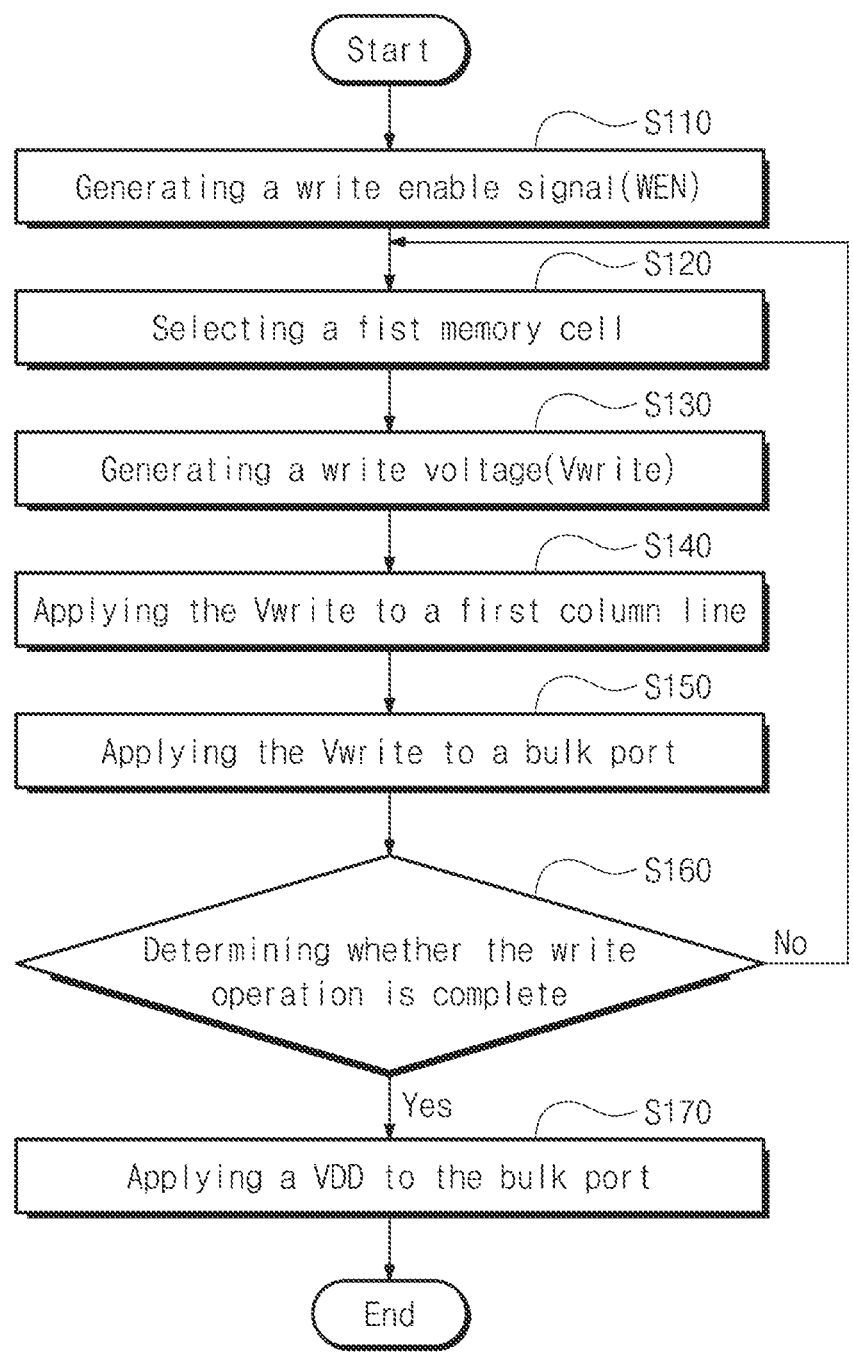
FIG. 10 is a flowchart illustrating an operation method of a memory device according to some embodiments of the present disclosure.

FIG. 10 is a flowchart illustrating an operation method of a memory device according to some embodiments of the present disclosure. Referring to FIGS. 1, 5 to 7, and 10, the memory device 100 may perform the write operation based on a write command received from an external device.

In operation S110, the memory device 100 may generate the write enable signal WEN based on the write command. For example, the control logic circuit 170 may generate the write enable signal WEN based on the write command. According to some embodiments, the control logic circuit 170 may generate the write enable signal WEN based on a read command or a standby command. The write enable signal WEN may include the high level or the low level. The control logic circuit 170 may provide the write enable signal WEN to the write driver 140.

In operation S120, the memory device 100 may select a memory cell, in which write data are to be written, in response to the write enable signal WEN. For example, the memory device 100 may select the first memory cell MC1, with which the first word line WL1, the first source line SL1, and the first bit line BL1 are connected, as the memory cell in which the write data are to be written. For example, the address decoder 130 may select the first word line WL1 and may provide the first column select signal CS1 to the column selector 120. The column selector 120 may select the first source line SL1 and the first bit line BL1 based on the first column select signal CS1.

In operation S130, the memory device 100 may generate the write voltage Vwrite in response to the write enable signal WEN. The write voltage Vwrite may be the parallel reference voltage REF_P or the anti-parallel reference voltage REF_AP. For example, to write data "0" as the write data DIN, the memory device 100 may apply the ground voltage VSS to the peripheral circuit source line SLp and may apply the parallel reference voltage REF_P to the peripheral circuit bit line BLp. In this case, the parallel reference voltage REF_P may be generated as the write voltage Vwrite. For example, to write data "1" as the write data DIN, the memory device 100 may apply the anti-parallel reference voltage REF_AP to the peripheral circuit source line SLp and may apply the ground voltage VSS to the peripheral circuit bit line BLp. In this case, the anti-parallel reference voltage REF_AP may be generated as the write voltage Vwrite. According to some embodiments, the peripheral circuit source line SLp and the peripheral circuit bit line BLp may be named as the "first data line DL1."

In operation S140, the memory device 100 may apply the write voltage Vwrite to a source line or a bit line connected with the selected memory cell. For example, the memory device 100 may apply the write voltage Vwrite to the first source line SL1 or the first bit line BL1 connected with the first memory cell MC1. For example, the first column multiplexer circuit 121 may include the first switch SW1 that operates in response to the first column select signal CS1. The first switch SW1 may correspond to the first column line CL1 including the first source line SL1 and the first bit line BL1.

According to some embodiments, the first switch SW1 may include the inverter INV, the source line selecting switch SCS, and the bit line selecting switch BCS. The inverter INV may receive the first column select signal CS1 and may output the first inverted column select signal /CS1. The source line selecting switch SCS and the bit line selecting switch BCS may be turned on based on the first column select signal CS1 of the high level. As such, the first column line CL1 may be connected with the first data line DL1, and the write voltage Vwrite may be applied to the first column line CL1.

In operation S150, the memory device 100 may apply the write voltage Vwrite to the bulk port PBULK. For example, the inverter INV, the source line selecting switch SCS, and the bit line selecting switch BCS of the first switch SW1 may include one or more PMOS transistors. The one or more PMOS transistors may be formed on a single n-well, and the n-well may be electrically connected with the bulk port PBULK.

According to some embodiments, the memory device 100 may control the PBULK switch SW_P in response to the write enable signal WEN. For example, the memory device 100 may apply a reference voltage having a relatively great magnitude selected from among the parallel reference voltage REF_P and the anti-parallel reference voltage REF_AP to the n-well through the bulk port PBULK in response to the write enable signal WEN of the high level. That is, the write voltage Vwrite may be applied to bodies of the one or more PMOS transistors. Therefore, even though the write voltage Vwrite that is greater than or equal to the power supply voltage VDD may be applied to the bodies through the sources of the one or more PMOS transistors, an occurrence of a latch-up phenomenon in which a current flows to a substrate through the bodies may prevented or reduced.

In operation S160, the memory device 100 may determine whether the write operation is completed. For example, the memory device 100 may determine the completion of the write operation by verifying whether the write data DIN are written in the first memory cell MC1. As illustrated in FIG. 3B, the memory device 100 may detect whether the variable resistance element MTJ of the first memory cell MC1 has the parallel resistance Rp or the anti-parallel resistance Rap. For example, assuming that the write data DIN are data "1," when the variable resistance element MTJ has the anti-parallel resistance Rap, the memory device 100 may determine that the write operation is completed. For example, assuming that the write data DIN are data "0," when the variable resistance element MTJ has the parallel resistance Rp, the memory device 100 may determine that the write operation is completed. When it is determined in operation S160 that the write operation is completed, operation S170 may be performed; when it is determined in operation S160 that the write operation is not completed, operations such as S120, S130, S140, and/or S150 may be performed again.

When the write operation is completed, in operation S170, the memory device 100 may apply the power supply voltage VDD to the bulk port PBULK. For example, when the write operation is completed, the memory device 100 may generate the write enable signal WEN of the low level and may control the PBULK switch SW_P based on the write enable signal WEN of the low level. For example, the memory device 100 may apply the power supply voltage VDD to the n-well through the bulk port PBULK in response to the write enable signal WEN of the low level.

Figure 11:
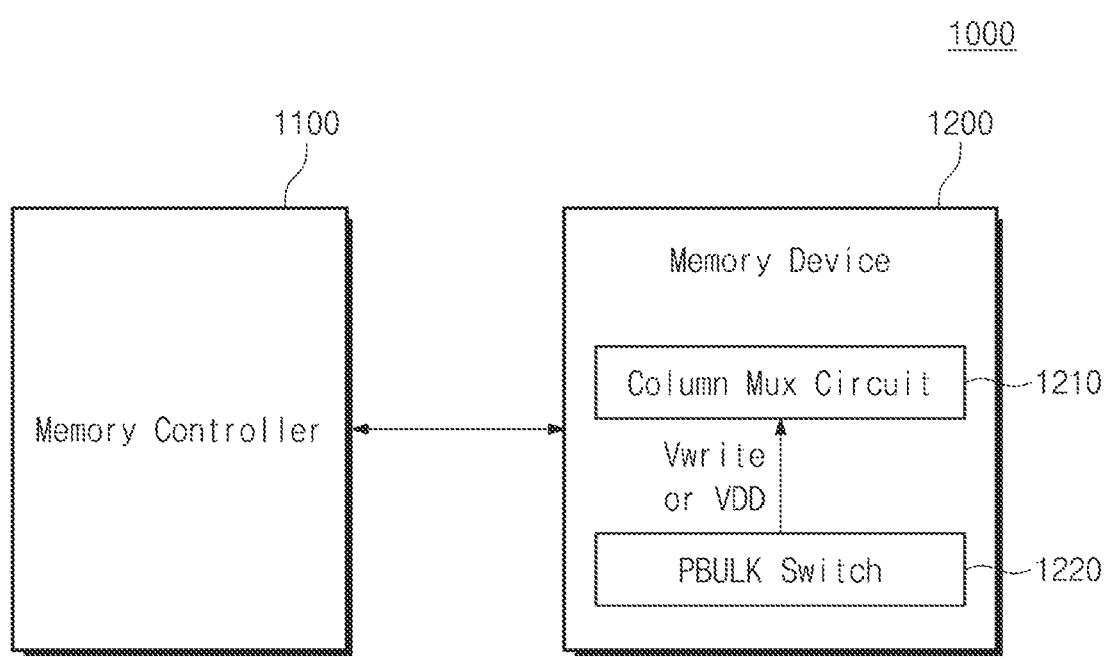
FIG. 11 is a block diagram illustrating a memory system according to some embodiments of the present disclosure.

FIG. 11 is a block diagram illustrating a memory system according to an embodiment of the present disclosure. Referring to FIG. 11, a memory system 1000 may include a memory controller 1100 and a memory device 1200. The memory controller 1100 may be configured to control the memory device 1200. According to some embodiments, the memory controller 1100 may be a semiconductor integrated circuit such as a central processing unit (CPU) or an application processor (AP) or may be one of components included therein.

The memory controller 1100 may control the memory device 1200 based on a given interface. For example, the given interface may be based on at least one of various interfaces such as a double data rate (DDR) interface, a low-power DDR (LPDDR), a universal serial bus (USB) interface, a multimedia card (MMC) interface, a peripheral component interconnection (PCI) interface, a PCI-express (PCI-e) interface, an advanced technology attachment (ATA) interface, a serial-ATA (SATA) interface, a parallel-ATA (PATA) interface, a small computer small interface (SCSI), an enhanced small disk interface (ESDI), an integrated drive electronics (IDE) interface, a mobile industry processor interface (MIPI), a nonvolatile memory-express (NVM-e) interface, and/or a universal flash storage (UFS) interface, with the present disclosure not limited to these examples.

The memory device 1200 may operate under control of the memory controller 1100. According to some embodiments, the memory device 1200 may be the memory device 100 described with reference to FIGS. 1 to 10. For example, the memory device 1200 may include a column multiplexer circuit 1210 configured to select a source line and a bit line, and a PBULK switch 1220. The PBULK switch 1220 may be configured to apply the write voltage Vwrite to a single n-well of the column multiplexer circuit 1210 in response to a write enable signal. For example, the write voltage Vwrite may be a voltage signal or voltage reference having a relatively great magnitude from among a parallel reference voltage and an anti-parallel reference voltage.

The memory device 1200 may include a path configured to transfer the write voltage Vwrite to the n-well of the column multiplexer circuit 1210 through the PBULK switch 1220. The write voltage Vwrite may be greater than the power supply voltage VDD, and the memory device 1200 may be configured to apply the write voltage Vwrite to the n-well of the column multiplexer circuit 1210, thus preventing or reducing occurrences of a latch-up phenomenon of the column multiplexer circuit 1210.

When the write operation is completed, the memory device 1200 may be configured to apply the power supply voltage VDD to the n-well of the column multiplexer circuit 1210 through the PBULK switch 1220. For example, the memory device 1200 may apply the power supply voltage VDD to the n-well of the column multiplexer circuit 1210 in a read operation or a standby operation. As such, the memory device 1200 may prevent the degradation of PMOS transistors due to the event that the write voltage Vwrite is greater in magnitude than the power supply voltage VDD that is applied to the n-well of the column multiplexer circuit 1210.

According to the present disclosure, as a column multiplexer circuit includes transistors whose oxides have a thickness of a given value or less, the area of a memory device may be reduced. Also, the memory device may prevent or reduce occurrence of a latch-up phenomenon in which a current flows through a bulk, by applying a write voltage greater than a power supply voltage to an n-well of a PMOS transistor.

While the present disclosure has been described with reference to some example embodiments thereof, it will be apparent to those of ordinary skill in the art that various changes and modifications may be made thereto without departing from the scope of the present disclosure as set forth in the following claims.

What is claimed is:

1. A memory device comprising:
 a control logic circuit configured to generate a write enable signal based on a write command;
 a first memory cell connected with a first word line and a first column line;
 a first write circuit configured to receive first write data to be stored in the first memory cell through a first write input/output line and to apply a write voltage to a first data line based on the first write data in response to the write enable signal; and
 a first column multiplexer circuit configured to select the first column line and to connect the first column line with the first data line in response to a first column select signal, such that the write voltage is applied to the first memory cell,
 wherein the first write circuit is further configured to apply the write voltage to a bulk port of the first column multiplexer circuit in response to the write enable signal, and
 wherein the first write circuit includes:
  a second switch configured to select between a ground voltage and a parallel reference voltage to be applied to the first data line based on the first write data; and
  a third switch configured to select between a power supply voltage and a high voltage signal selected from among an anti-parallel reference voltage and the parallel reference voltage to be applied to the bulk port based on the write enable signal.

2. The memory device of claim 1, wherein the first column line includes a first source line and a first bit line, wherein the first memory cell includes:
 a first access transistor; and
 a variable resistance element connected between the first access transistor and the first bit line,
 wherein the first access transistor is connected between the variable resistance element and the first source line and is configured to operate in response to a voltage of the first word line.

3. The memory device of claim 1, wherein the first write circuit further includes:
 a first switch configured to select one of a ground voltage and the anti-parallel reference voltage to be applied to the first data line based on the first write data.

4. The memory device of claim 3, wherein the first switch is configured to select the ground voltage when the first write data are of a first bit value and is configured to select the anti-parallel reference voltage when the first write data are of a second bit value, and
 wherein the second switch is configured to select the parallel reference voltage when the first write data are of the first bit value and is configured to select the ground voltage when the first write data are of the second bit value.

5. The memory device of claim 3, wherein the third switch is configured to select the high voltage signal in response to the write enable signal of a high level and is configured to select the power supply voltage in response to the write enable signal of a low level.

6. The memory device of claim 1, wherein the first column line includes a first source line and a first bit line, and
 wherein the first data line includes a peripheral circuit source line and a peripheral circuit bit line.

7. The memory device of claim 6, wherein the first column multiplexer circuit includes:
 an inverter configured to output an inversion signal of the first column select signal;
 a source line selecting switch configured to connect the first source line and the peripheral circuit source line based on the first column select signal and the inversion signal; and
 a bit line selecting switch configured to connect the first bit line and the peripheral circuit bit line based on the first column select signal and the inversion signal.

8. The memory device of claim 7, wherein each of the inverter, the source line selecting switch, and the bit line selecting switch includes one or more NMOS transistors and one or more PMOS transistors, and
 wherein the one or more NMOS transistors are turned on in response to the first column select signal of a high level and are turned off in response to the first column select signal of a low level.

9. The memory device of claim 8, wherein the one or more PMOS transistors include an oxide having a thickness of less than or equal to a given value.

10. The memory device of claim 8, wherein the one or more PMOS transistors are formed on a single n-well, and
 wherein the single n-well is electrically connected with the bulk port.

11. The memory device of claim 10, wherein the first write circuit is configured to apply the write voltage to the single n-well through the bulk port in response to the write enable signal, and
wherein the write voltage includes a high voltage signal selected from among an anti-parallel reference voltage and a parallel reference voltage.

12. The memory device of claim 1, wherein the control logic circuit is configured to generate the write enable signal of a low level based on a read operation command or a standby command, and
wherein the first write circuit is configured to apply a power supply voltage to the bulk port in response to the write enable signal of the low level.

13. A memory device comprising:
a control logic circuit configured to generate a write enable signal based on a write command;
a first memory cell connected with a first word line, a first source line, and a first bit line;
a first write circuit including a first switch configured to apply an anti-parallel reference voltage to a peripheral circuit source line based on first write data to be stored in the first memory cell, a second switch configured to apply a parallel reference voltage to a peripheral circuit bit line based on the first write data, and a third switch configured to apply a high voltage signal from among the anti-parallel reference voltage and the parallel reference voltage to a bulk port based on the write enable signal; and
a first column multiplexer circuit including a source line selecting switch configured to connect the peripheral circuit source line and the first source line based on a first column select signal, a bit line selecting switch configured to connect the peripheral circuit bit line and the first bit line based on the first column select signal, and the bulk port,
wherein the bulk port is electrically connected with a single n-well shared by at least two PMOS transistors included in the source line selecting switch and the bit line selecting switch.

14. The memory device of claim 13, wherein the first memory cell includes a magnetic random access memory (MRAM) cell.

15. The memory device of claim 13, wherein the third switch is configured to apply the high voltage signal to the bulk port in response to the write enable signal of a high level, and is configured to apply a power supply voltage to the bulk port in response to the write enable signal of a low level.

16. The memory device of claim 15, wherein the first column multiplexer circuit further includes a CMOS inverter configured to output an inversion signal of the first column select signal, and
wherein a PMOS transistor of the CMOS inverter shares the single n-well and is configured to receive the high voltage signal.

17. An operation method of a memory device configured to perform a write operation based on a write command received from an external device, the method comprising:
generating a write enable signal based on the write command;
controlling a word line, a source line, and a bit line to select a memory cell, in which write data are to be written, in response to the write enable signal;
generating a write voltage in response to the write enable signal;
applying the write voltage to the source line or the bit line connected with the memory cell;
applying the write voltage to a bulk port of a column multiplexer circuit configured to select the source line and the bit line; and
applying a power supply voltage to the bulk port when the write operation is completed,
wherein the memory cell includes a magnetic random access memory (MRAM) cell,
wherein the column multiplexer circuit includes one or more inverters, a source line selecting switch, and a bit line selecting switch,
wherein a plurality of PMOS transistors included in the one or more inverters, the source line selecting switch, and the bit line selecting switch share an n-well, and
wherein the bulk port is electrically connected with the n-well.

18. The method of claim 17, wherein the applying of the write voltage to the bulk port includes:
controlling a PBULK switch connected with the bulk port in response to the write enable signal of a high level; and
applying a high magnitude voltage signal selected from among a parallel reference voltage or an anti-parallel reference voltage to the n-well through the bulk port based on a switching operation of the PBULK switch.

19. The method of claim 17, wherein the applying of the power supply voltage to the bulk port includes:
determining whether the write operation is completed;
when it is determined that the write operation is completed, controlling a PBULK switch connected with the bulk port in response to the write enable signal of a low level; and
applying the power supply voltage to the n-well through the bulk port based on a switching operation of the PBULK switch.

* * * * *